(12) United States Patent
Lu et al.

(10) Patent No.: US 7,061,099 B2
(45) Date of Patent: Jun. 13, 2006

(54) MICROELECTRONIC PACKAGE HAVING CHAMBER SEALED BY MATERIAL INCLUDING ONE OR MORE INTERMETALLIC COMPOUNDS

(75) Inventors: Daoqiang Lu, Chandler, AZ (US); John Heck, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/955,872

(22) Filed: Sep. 30, 2004

(65) Prior Publication Data

US 2006/0071324 A1    Apr. 6, 2006

(51) Int. Cl.
*H01L 23/12*   (2006.01)
*H01L 23/10*   (2006.01)

(52) U.S. Cl. .................. 257/704; 257/710; 257/723; 257/924

(58) Field of Classification Search ................ 257/704, 257/778, 723, 762, 710, 924, E23.128, E23.18, 257/E23.193, E21.501
See application file for complete search history.

(56) References Cited

U.S. PATENT DOCUMENTS

| | | | |
|---|---|---|---|
| 4,537,467 A | 8/1985 | Dubon et al. | |
| 4,747,908 A | 5/1988 | Potter | |
| 5,053,195 A | 10/1991 | MacKay | |
| 5,061,442 A | 10/1991 | Ozimek | |
| 5,672,913 A | 9/1997 | Baldwin et al. | |
| 6,303,986 B1 * | 10/2001 | Shook | 257/680 |
| 6,441,480 B1 | 8/2002 | Takeuchi et al. | |
| 6,511,236 B1 | 1/2003 | Webjorn et al. | |
| 6,603,093 B1 | 8/2003 | Epitaux et al. | |
| 6,673,697 B1 | 1/2004 | Ma et al. | |
| 6,713,314 B1 | 3/2004 | Wong et al. | |
| 6,809,412 B1 * | 10/2004 | Tourino et al. | 257/678 |
| 2002/0000649 A1 * | 1/2002 | Tilmans et al. | 257/678 |

OTHER PUBLICATIONS

D.F. Baldwin, et al. "Gallium Alloy Interconnects For Flip-Chip Assembly Applications", in *Proc. Electron Comp. Technol. Conf.*, Orlando, FL, May 1996, pp. 1143-1150.
"Amalgams as alternative microelectronic interconnect materials," *Sensors Electron. Packag., ASME,* vol. MED-vol. 3/EEP-vol. 14, pp. 55-63, 1995.

(Continued)

*Primary Examiner*—Jasmine Clark
(74) *Attorney, Agent, or Firm*—Blakely, Sokoloff, Taylor & Zafman LLP (57) ABSTRACT

Microelectronic packages having chambers and sealing materials, and methods of making the packages, and sealing the chambers, are disclosed. An exemplary package may include a first surface, a second surface, a solid sealing material including an intermetallic compound, such as, for example, of gallium or another relatively low melting material, between the first surface and the second surface, and a chamber defined by the first surface, the second surface, and the sealing material. An exemplary method may include disposing a ring of a sealing material including a liquid metal between a first surface and a second surface to define a chamber between the first surface, the second surface, and the ring of the sealing material, and sealing the chamber by heating the sealing material to react the liquid metal with a metal that is capable of forming an intermetallic compound with the liquid metal.

24 Claims, 7 Drawing Sheets

OTHER PUBLICATIONS

"Preparation and properties of gallium alloys for use as microelectronic interconnect materials," *Int. J. Microcircuits Electron. Packag.*, vol. 19, pp. 37-45, 1995.

G. G. Harman, "Hard gallium alloys for use as low contact resistsance electrodes and for bonding thermocouples into samples", Rev. Sci. Instr., vol. 31, pp. 717-720, 1960.

C. A. MacKay, Amalgams for improved electronics interconnection, *IEEE Microelectron.*, pp. 46-58, Apr. 1993.

"Packaging the Micro-machine", Amkor Technology, pp. 1-6.

J. Grobner, et al., Thermodunamic Calculation of the Binary Systems M-Ga and Investigation of Ternary M-Ga-N Phase Equilibria (M=Ni, Co, Pd, Cr). (1999) pp. 1-24.

* cited by examiner

MICROELECTRONIC PACKAGE HAVING CHAMBER SEALED BY MATERIAL INCLUDING ONE OR MORE INTERMETALLIC COMPOUNDS

BACKGROUND

1. Field

Embodiments of the invention relate to microelectronic packages having chambers and sealing materials, to methods of making the packages, and to sealing materials that may be included in the packages.

2. Background Information

Microelectromechanical systems (MEMS) may be sealed in chambers of microelectronic packages in order to protect their potentially fragile structures from damage, and shield them from the environment. Sealing materials are commonly used to seal the MEMS within the chambers.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
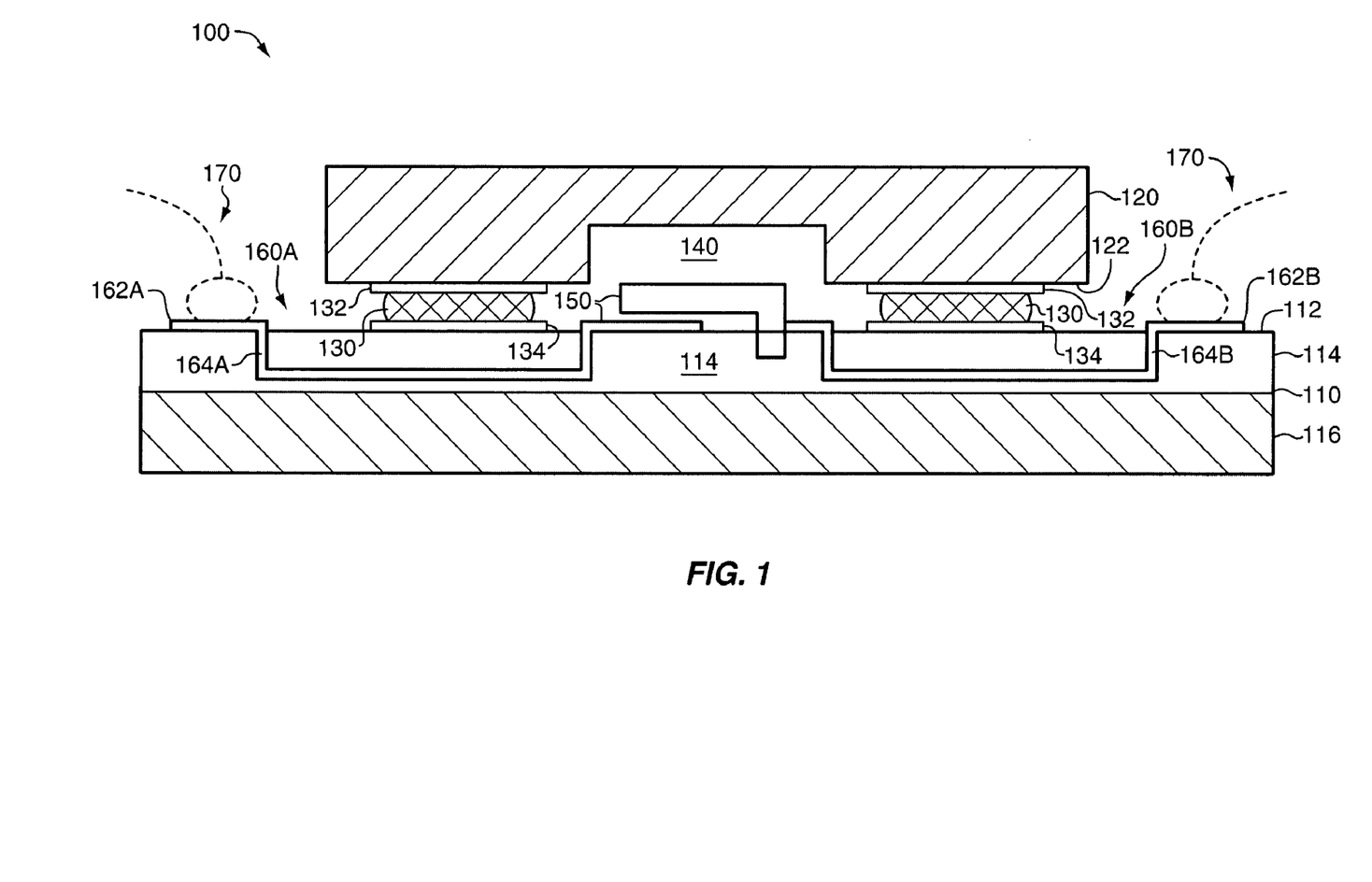
FIG. 1 shows an enlarged cross-sectional view of a microelectronic package, according to one or more embodiments of the invention.

FIG. 1 shows an enlarged cross-sectional view of a microelectronic package 100, according to one or more embodiments of the invention. The microelectronic package may also be referred to as a module. The package includes a substrate 110, such as, for example, a singulated die, a cap 120 facing the substrate, a sealing material 130 including one or more intermetallic compounds, such as, for example, of gallium, between the substrate and the cap, a chamber 140 defined by the substrate, the cap, and the sealing material, one or more electronic or microelectronic components 150, such as, for example, one or more microelectromechanical systems (MEMS) coupled with the substrate within the chamber, and one or more interconnects 160A, 160B to couple the one or more microelectronic components with a signaling medium 170 that may be located outside the chamber.

The package includes the substrate 110. The term substrate may refer to a workpiece object having a portion that has been transformed by a sequence of operations into microelectronic circuits, structures, or other configurations. In one aspect, the substrate may include a die. The die may be singulated or otherwise separated from a wafer, for example. Dice are also occasionally referred to as chips, monolithic devices, semiconductor devices, integrated circuits, or microelectronic devices. In another aspect, the substrate may include a wafer. The die or wafer may include one or more semiconductor materials, for example, silicon, non-semiconductor materials, or a combination thereof.

The package also includes the cap 120. The cap may represent a structure, such as a lid or cover, for example, that forms a portion of the housing defining the chamber. In one aspect, the cap may include a discrete preformed die cap that may be pick-and-placed on a wafer or singulated die. Alternatively, the cap may include a wafer cap, such as, for example, a cavity wafer, that may be bonded to a wafer and then singulated along with the dice. A variety of materials may be used for the cap, including, but not limited to, ceramics, glass, silicon, metals, plastics, other organic materials, and combinations thereof.

In the illustrated embodiment, an upper surface 112 of the substrate is facing, and may be substantially aligned below, a lower surface 122 of the cap. It should be noted that terms such as "upper", "lower", "top", "bottom", "right", "left", "vertical", and the like, are used herein to facilitate the description of the structure of the package "as illustrated". It will be evident that the apparatus may be used in a variety of orientations including, but not limited to, an inverted orientation in which the substrate is on the top and the cap is on the bottom.

Between the substrate and the cap is the chamber 140. In the illustrated embodiment, the chamber includes a void or cavity defined in the cap, although the invention is not limited in this respect. In one or more embodiments, the chamber may include a void or cavity etched, carved, or otherwise formed in the substrate, or matching or otherwise corresponding cavities in both the cap and the substrate. Depending upon the particular implementation, no void or cavity is required, if the thickness of the sealing material is sufficient.

Around a periphery of the chamber, disposed between the upper surface of the substrate and the lower surface of the cap, is the sealing material 130. In one or more embodiments of the invention, the sealing material may include a ring of sealing material that extends around the periphery of the chamber. As used herein, the term "ring" does not necessarily imply circularity. The ring may have a circular, rectangular, square, polygonal, curvilinear, or other closed plane shape. In the illustrated orientation, the sealing material defines the vertical walls of the chamber, and the substrate and the cap respectively define the floor and the ceiling of the chamber, although this particular orientation is not required. For example, inverted and tilted orientations are contemplated.

The sealing material may represent a material of closure or containment of the chamber. The sealing material may tend to prevent, or at least reduce, the exchange of materials between the chamber and an environment outside the chamber. For example, depending upon the particular implementation, the sealing material may tend to reduce the entry of ambient air, water, such as, for example moisture, or other materials into the chamber. As other examples, the sealing material may help to reduce the pressurization of a vacuous chamber, reduce the loss of pressure from a pressurized chamber, and/or limit the escape of a noble gas, other inert material, or other material that may be included in the chamber. In one aspect, the sealing material may include a hermetic sealing material, although the scope of the invention is not limited in this respect.

In one or more embodiments of the invention, the sealing material may include a solid material, such as, for example, a metal, including one or more intermetallic compounds. As used herein, unless stated otherwise, the term "metal" may refer to either a pure metal (for example gallium, copper, nickel, etc.), or an intermetallic compound, alloy, mixture, stack, agglomerate, or other combination of two or more metals. Non-metals, such as, for example, silica fillers, may also optionally be included in the metal.

The term "intermetallic compound" may refer to a type of material formed when atoms of two or more different metals combine in a substantially fixed stoichiometric ratio to produce a distinct material that may have different properties, such as, for example crystal structure and/or melting point, from those of the individual metals. In practice, the intermetallic compound may potentially deviate from the ideal fixed ratio that may be expected if the intermetallic compound was formed in a laboratory under highly controlled or ideal conditions. The invention is not limited to intermetallic compounds having the ideal fixed ratio.

In one or more embodiments of the invention, the intermetallic compound may include one or more relatively low melting metals that have melting point temperatures that are less than about 100° C., 150° C., 200° C., or 250° C. These metals may be melted and applied as liquid metals by printing or dispensing, for example. Examples of such metals include, but are not limited to, gallium, cesium, indium-gallium (InGa), tin gallium (SnGa), and combinations thereof, to name just a few examples.

In one or more embodiments of the invention, the sealing material may include one or more intermetallic compounds including gallium and one or more metals that are capable of forming the one or more intermetallic compounds with the gallium. Suitable metals that form one or more intermetallic compounds with gallium include, but are not limited to, nickel, copper, silver, antimony, cobalt, gold, platinum, nickel-silver, copper-nickel, copper-silver, copper-tin, and combinations thereof, to name just a few examples. To further illustrate, specific examples of nickel-gallium intermetallic compounds include, but are not limited to, $Ni_3Ga$, $Ni_5Ga_3$, $Ni_3Ga_2$, $NiGa$, $Ni_3Ga_4$, $Ni_2Ga_3$, and $NiGa_4$. A specific example of a gallium-copper intermetallic compound is $Cu_7Ga_3$. The use of nickel and copper may offer certain potential advantages, such as, for example, being comparatively inexpensive, readily available, and widely used and tested in the microelectronic device fabrication arts.

Other intermetallic compounds having gallium include, but are not limited to, antimony-gallium intermetallic compounds, such as, for example, $SbGa$, gallium-silver intermetallic compounds, such as, for example, $GaAg_3$, gold-gallium intermetallic compounds, such as, for example, $AuGa_2$, cobalt-gallium intermetallic compounds, such as, for example, $CoGa$ and $CoGa_3$, titanium-gallium intermetallic compounds, such as, for example, $TiGa_3$ and $TiGa_2$, palladium-gallium intermetallic compounds, such as, for example, $Pd_2Ga$ and $Pd_3Ga$.

Intermetallic compounds that do not include gallium are also suitable. Examples include, but are not limited to, indium-antimony intermetallics, such as, for example, $InSb$, cesium-antimony intermetallic compounds, such as, for example, $Cs_3Sb$ or $Cs_2Sb$, and cesium-tin intermetallic compounds, such as, for example, $CsSn$ or $CsSn_4$.

Many of the above-identified types of intermetallic compounds have relatively high melting point temperatures that may be higher than the corresponding melting point temperatures of the individual metals, such as, for example, gallium, due at least in part, to comparatively strong attractions between the metals that form the intermetallic compounds. In one aspect, forming the intermetallic compounds in situ in the package may include converting a liquid, which may without limitation be printed or dispensed easily as a liquid, to a sold intermetallic. For example, gallium has a melting point of about 30° C., cesium has a low melting point of around 28° C., indium has a melting point of about 157° C., and may also optionally be printed or dispensed as a liquid. and may easily be applied by a liquid by a printer or dispenser that is adapted to heat the gallium to above its melting point temperature. Other metals described herein similarly have melting point temperatures that would allow them to be applied as liquids. The melting point temperatures of the intermetallic compounds formed from these liquid metals are generally much higher. For example, the melting point temperatures of many intermetallic compounds of gallium are greater than about 280° C. Due in part to these higher melting point temperatures, the sealing materials may remain solid and the seals intact during potential subsequent high temperature operations and application environments.

The above-described sealing materials generally do not require a flux and in one embodiment may consist essentially of non-organic materials. Formed solders may include residual organic materials derived from flux. If used as a sealing material, the organic materials from a solder, or derivatives thereof, may potentially contaminate a MEMS in the chamber. Additionally, some solders include lead, which may offer known environmental and regulatory disadvantages. Lead is also not required in the sealing material. Still further, as will be described below, the intermetallic compounds may often optionally be formed at relatively low temperatures that tend not to damage components of the package.

Referring again to FIG. 1, the illustrated package includes first optional contact structures 132 and second optional matching or otherwise corresponding contact structures 134. The first and the second contact structures may each include rings that match or otherwise correspond in position with each other, and with the sealing material, when the substrate and cap are aligned, and when the sealing material is applied. The contact structures may also optionally match or correspond in size, shape, or other attributes. The rings may be formed by approaches such as, for example, electroplating, electroless plating, physical vapor deposition, or chemical vapor deposition, and may have a thickness of from about 0.5 to 10 micrometers (μm, one millionth of a meter), although the invention is not limited to a thickness in this range.

The first contact structure is disposed between the cap and the sealing material. The second contact structure is disposed between the substrate and the sealing material. In the illustrated embodiment, the first and the second contact structures are subjacent and superjacent to the cap and the substrate, respectively. However, this is not required. In one or more other embodiments, either one or both of the contact structures may optionally be at least partially or fully embedded. Still further, a material, such as, for example, an insulating material, may optionally be disposed between the first contact structure and the cap, or between the second contact structure and the substrate, or both.

In one or more embodiments of the invention, the contact structures may include one or more metals that are capable of forming one or more intermetallic compounds with a metal of the sealing material, such as, for example, gallium. After the sealing material is introduced over the contact structure, intermetallic compound formation reactions may take place between the metal of the sealing material, such as, for example, the gallium, and the one or more metals of the contact structure. The intermetallic compounds formed in these reactions may help to improve contact and adhesion of the sealing material to the contact structures, which may potentially help to seal the chamber.

Figure 2:
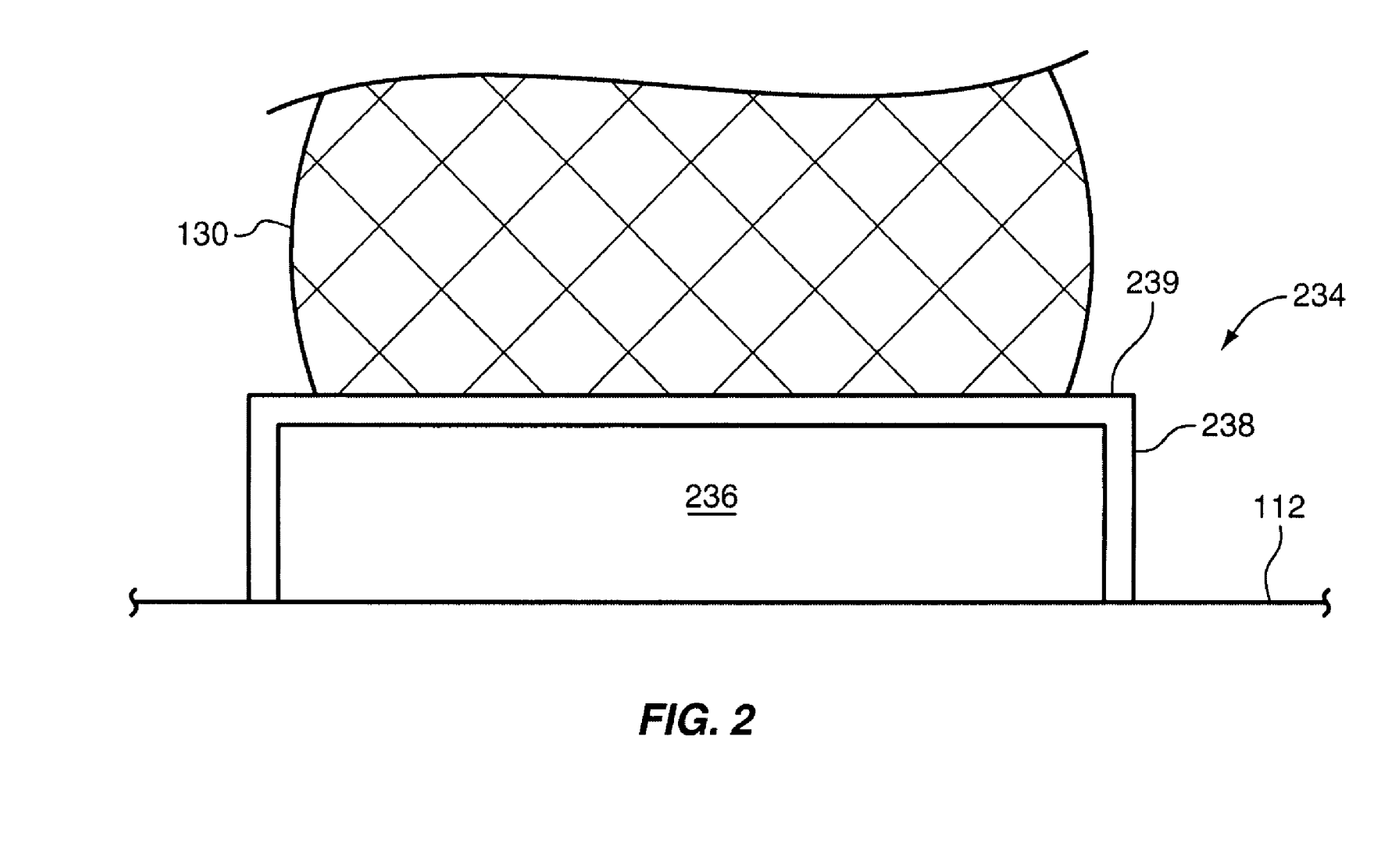
FIG. 2 shows an enlarged cross-sectional view of a sealing material contact structure including an anti-oxidation layer, according to one or more embodiments of the invention.

FIG. 2 shows an enlarged cross-sectional view of a portion of a microelectronic package including a contact structure 234 having an anti-oxidation layer 238, according to one or more embodiments of the invention. The contact structure is coupled with a substrate surface 112, and a sealing material 130 is coupled with the contact structure. The contact structure includes an underlying portion 236 coupled with the surface, and an anti-oxidation layer 238 coupled with, and overlying, the underlying portion. The underlying portion may have characteristics of a contact structure as described above. The anti-oxidation layer may be on the outermost surface of the contact structure. In the illustrated embodiment, the anti-oxidation layer is on both the top and the sidewalls, although portions of the layer may optionally be omitted from the sidewalls. The sealing material is coupled with, overlies, and is adjacent to, an upper surface 239 of the anti-oxidation layer.

In one or more embodiments of the invention, the anti-oxidation layer may include a material, such as, for example, gold, or another noble metal, or another material that oxidizes less readily than another metal of the contact structure, such as, for example, nickel. Reducing oxidation may tend to enhance the wetting and contact of the contact structure with the sealing material. Noble metals may tend to be more resistant to corrosion and oxidation than nickel, for example, and many other non-noble metals. In one aspect, the anti-oxidation layer may be thin and may have a thickness in the range of from about a monolayer to about 0.05 µm, although the scope of the invention is not limited in this respect. Thicker layers may also optionally be used. For example, a layer may have a thickness up to about 1.5 µm. An example of an anti-oxidation layer includes a thin layer of gold formed by immersing the contact structure in a gold immersion bath or solution including one or more gold compounds, such as, for example, $KAu(CN)_2$ or a sulfite based gold plating solution, and potentially one or more supporting compounds. Another example may include a thicker layer of gold or another noble metal that may be formed, for example, by electroplating, electroless plating, or physical vapor deposition.

Referring again to FIG. 1, the package also includes the one or more microelectronic or other electronic components 150 coupled with the substrate within the chamber. In the illustrated embodiment, the one or more components include a released MEMS, although the invention is not so limited.

The term "MEMS" may refer to a miniaturized or "micro" device typically having three-dimensional structure and capable of electro-mechanical transduction, such as, for example, mechanical motion in response to an electrical signal, and/or an electrical signal in response to mechanical motion. As used herein, the terms "microelectromechanical systems" and "MEMS" may encompass microoptoelectromechanical systems (MOEMS) that include an optical component, as well as bioMEMS. Also, for clarity, the term "MEMS" may be used to refer to either a single microelectromechanical system or multiple microelectromechanical systems. The terms "microelectromechanical system" and "MEMS", as used herein, also encompass devices referred to as micromachines, for example in Japan, and/or micro systems technology (MST) devices, for example in Europe.

The illustrated MEMS includes a cantilever beam and contact plate. A dimension of the MEMS, such as a width of the cantilever beam and/or contact plate, may be less than about a millimeter (mm, one thousandth of a meter) and more than about a micrometer (µm, one millionth of a meter). Not all dimensions have to be sized so small. For example, another dimension of the MEMS, such as the length of the cantilever beam, may optionally be longer than a millimeter, if appropriate.

The invention is not limited to this particular MEMS. Other MEMS are also suitable. In accordance with one or more embodiments of the invention, one or more switches, tunable switches, cantilever beam arrays, resonators, film bulk acoustic resonators (FBARs), FBAR filters, varactors, radio-frequency MEMS, hinged mirrors, pressure sensors, tunable capacitors, accelerometers, or combinations thereof, may be sealed in the chamber. Sealing the one or more MEMS in the chamber may help to provide protection and reduce stiction and corrosion, for example. However, it is emphasized that the invention is not limited in utility to sealing MEMS in the chamber. A wide variety of other types of components and materials may optionally be sealed in the chamber. Specific examples include, but are not limited to, transistors, light emitting diodes (LEDs), photodetectors, vacuums, gases, liquid crystals, and the like. In one aspect, another material, structure, or device that may benefit from being sealed in a controlled environment, such as one that is sensitive to moisture or oxygen, for example, may be included in the chamber.

The electronic component may be physically and electrically coupled with the package. In the illustrated embodiment, the contact plate and a base of the cantilever beam are physically attached to the upper surface of the substrate and one or both may be electrically connected to a conductive material or configuration of the substrate. The conductive material may include a microelectronic circuit, line, or other configuration of the substrate representing a signaling medium, path, or other interconnect to couple the MEMS with interconnects to an external signaling medium outside the chamber. The conductive material may include metals, doped semiconductor materials, other conductive materials, and combinations thereof.

Referring again to FIG. 1, the package includes the one or more interconnects 160A, 160B. In the illustrated embodiment, only two interconnects are shown, including a first interconnect 160A (on the left), and a second interconnect 160B (on the right). The invention is not limited to two interconnects.

The interconnects may include conductive materials and structures to electrically couple the one or more electronic components in the chamber with the external signaling medium through a conductive path, link, or signaling medium. Metals, such as, for example, aluminum, copper, gold, or the like, may be included in the interconnects due, at least in part, to their high conductivities. In one aspect, the materials described as sealing materials elsewhere herein, such as, for example, intermetallic compounds including gallium, may be printed, dispensed, or otherwise applied as interconnect materials. However, electrically conductive materials or conductors other than metals, such as, for example, doped polysilicon, doped single-crystal silicon, refractory metal silicides, and combinations of such materials, are also suitable.

The first interconnect includes a first conductive pad 162A and a first conductive path 164A. The second interconnect includes a second conductive pad 162B and a second conductive path 164B. The conductive paths may include lines, traces, or other paths of conductive interconnect material, such as, for example, one or more metals, between conductors inside the chamber, and conductors outside the chamber, such as, for example, the conductive pads. Each of the conductive paths has a first terminal end or portion and a second terminal end or portion. In particular, the first interconnect includes a first terminal end coupled with the first conductive pad, and a second terminal end coupled with the contact plate of the MEMS. Likewise, the second interconnect includes a first terminal end coupled with the second conductive pad, and a second terminal end coupled with the cantilever beam of the MEMS.

An insulating layer 114 overlies, and is superjacent to, an underlying portion 116 of the substrate. The insulating layer may include an insulating or dielectric material. In one aspect, the insulating layer may include an oxide of silicon, such as, for example, silicon dioxide ($SiO_2$). Other insulating materials or dielectrics, such as, for example, polymeric foams or other organic insulating materials may also optionally be used. Such insulating materials may help to prevent, or at least reduce the risk of, an unintended electrical connection between the sealing material and the contact structure and/or the substrate.

Between the terminal ends or portions of the conductive paths are middle portions of the conductive paths. In one or more embodiments of the invention, if the sealing material is conductive, the middle portions of the conductive paths, which are located under or otherwise proximate the sealing material, may be buried or disposed in the insulating layer. The insulating layer may be disposed between the sealing material, which may include a conductive intermetallic compound, and the conductive paths and/or the substrate. However, an insulating layer is not required, for example, if the sealing material or contact structures include a dielectric material, and/or if the substrate is sufficiently insulating to the reduce risk of an electrical connection or short. Further, burying the middle portions in the insulating layer is not required. For example, in one or more embodiments, the lower contact structures 134 may include an insulating material.

The conductive pads 162A, 162B, which may represent conductive contact structures, and which may include one or more metals or other conductive materials, are coupled with the first terminal ends of the conductive paths. In the illustrated embodiment, the conductive pads overly, and are superjacent to, the first terminal ends of the conductive paths, and overly, and are superjacent to the insulating layer.

The conductive pads are on the outside or external surface of the package and may be used to connect or couple the package with an external signaling medium, for example, through wirebonding. Examples of external signaling mediums include, but are not limited to, circuits, printed circuit boards, electronic devices, and testing equipments, to name just a few. In the illustrated embodiment, dashed lines are used to indicate how wirebonding may be used to couple the package with the external signaling medium. A solder ball and thin gold wire, for example having a diameter of about 30 μm, may be used as a package lead to connect to the conductive pads.

As shown, in the illustrated embodiment, a horizontal dimension, such as a length and/or a width, of the cap may be less than a corresponding dimension of the substrate. In part, this may allow improved access to the conductive pads. In one or more embodiments of the invention, external interconnect structures may be exposed in a wafer bonding sequence, prior to singulation, for example by sawing, as disclosed in co-pending U.S. patent application Ser. No. 10/882,635, entitled "MODULE INTEGRATING MEMS AND PASSIVE COMPONENTS", filed on Jun. 30, 2004.

Figure 3:
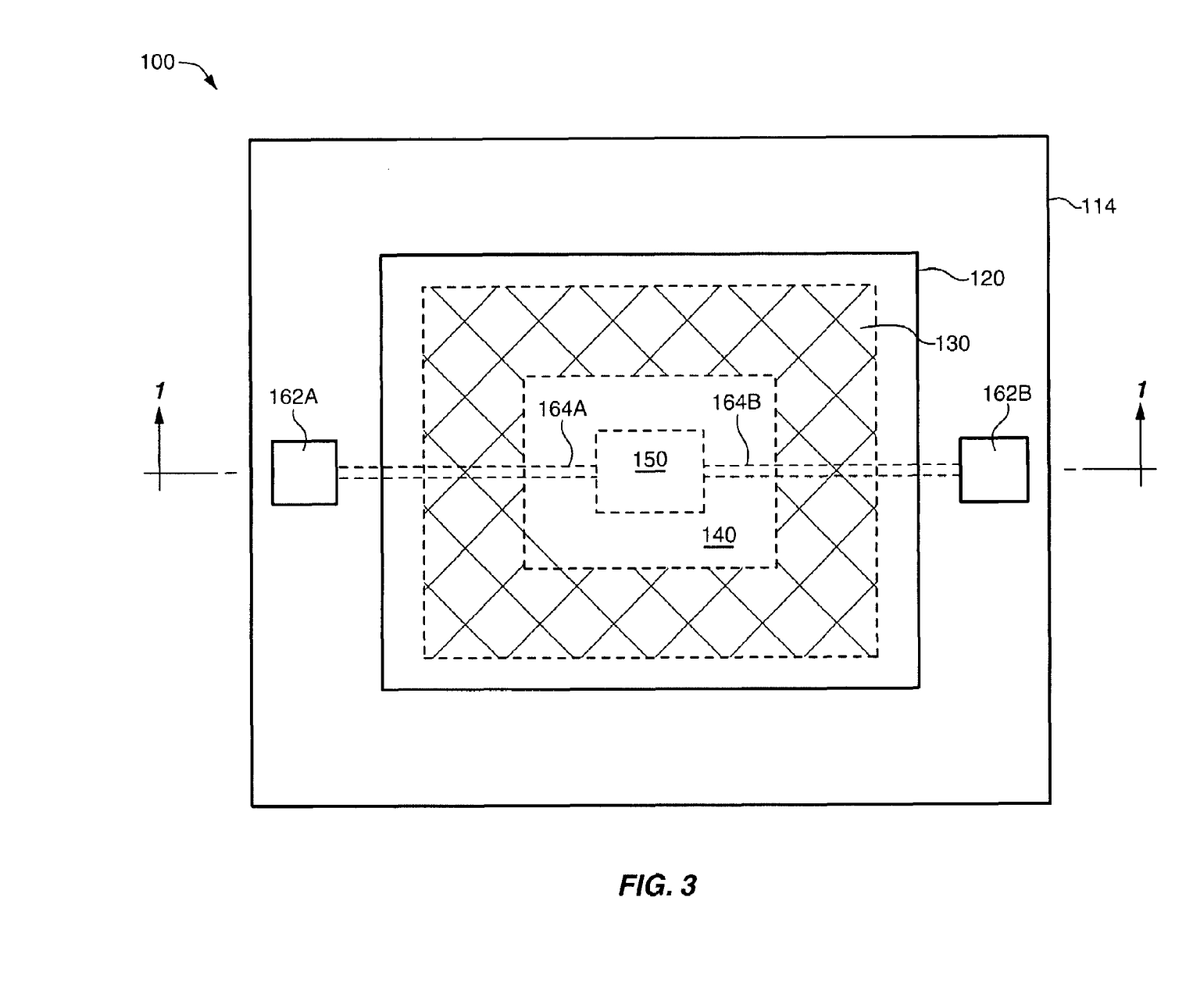
FIG. 3 shows a top planar view of the package of FIG. 1, according to one or more embodiments of the invention.

FIG. 3 shows a top planar view of the package 100 of FIG. 1. A section line 1—1 shows the location of the cross-section used for FIG. 1. The size selected for the top view is slightly changed compared to the size of the cross-sectional view. Some hatching is omitted to avoid obscuring the view.

The top surfaces of the insulating layer 114, the cap 120, and the conductive pads 162A, 162B are visible. Dashed lines are used to show the location of the rectangular ring of sealing material 130, the electronic component 150, and the conductive paths 164A, 164B, which may be underneath the cap and/or the insulating layer, and which may be hidden in the view. In the illustration, two conductive paths and pads are shown, although the invention is not limited to two paths.

Figure 4:
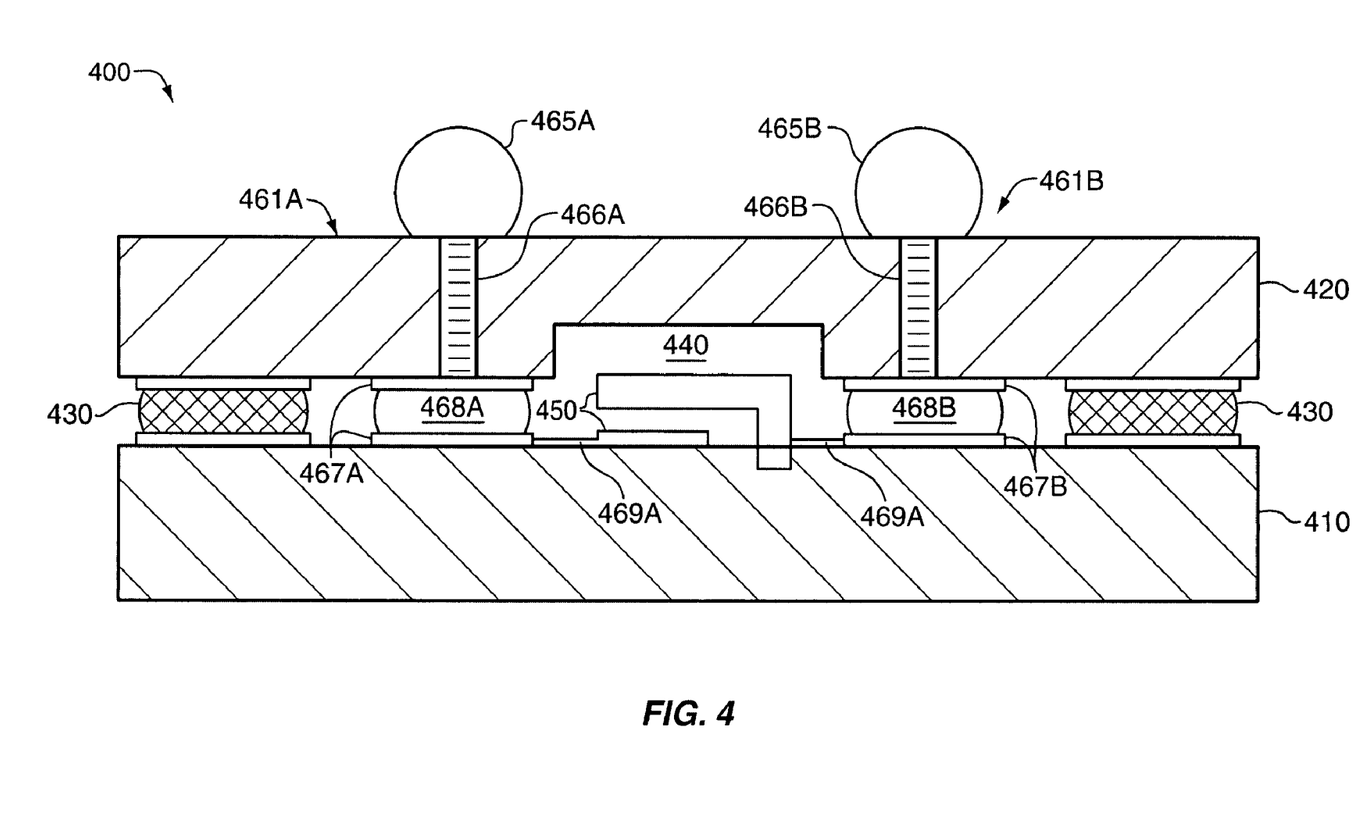
FIG. 4 shows an enlarged cross-sectional view of a package including vias to couple the package with an external signaling medium, according to one or more embodiments of the invention.

The invention is not limited to the use of the particular interconnect structures shown in FIGS. 1 and 3. FIG. 4 shows an enlarged cross-sectional view of a package 400 including vias through the cap to couple the package with an external signaling medium. The package includes a substrate 410, a cap 420 facing the substrate, a sealing material 430 between the substrate and the cap, a chamber 440 defined by the substrate, the cap, and the sealing material, and one or more electronic components 450 coupled with the substrate within the chamber. The components of the package 400 may optionally have some or all of the characteristics of the correspondingly named components of the package 100 shown in FIGS. 1 and 3. To avoid obscuring the following description, the discussion below will primarily focus on the different and/or additional structures and characteristics of the package 400.

The illustrated package includes a first interconnect 461A (on the left), and a second interconnect 461B (on the right). The invention is not limited to this number of interconnects. The first interconnect includes a first optional conductive interconnect material outside the chamber 465A, such as, for example, a solder bump, a first via 466A, such as, for example, a void in the cap filled with or otherwise including a conductive material, and a first conductive interconnect material inside the chamber 467A, 468A. The second interconnect likewise includes a second conductive interconnect material outside the chamber 465B, a second via 466B, and a second conductive interconnect material inside the chamber 467B, 468B.

As show in the illustrated embodiment, the conductive material in the chamber may include optional conductive pads 467A, 467B, and conductive bonding materials 468A, 468B, disposed between the pads. In one or more embodiments of the invention, the conductive pads may include the same or similar material as the contact structures used for the sealing material. In one or more embodiments of the invention, the conductive bonding material may include a material described elsewhere herein as a sealing material, such as, for example, a material including one or more intermetallic compounds. The use of such materials may potentially allow realization of certain advantages, such as, for example, an ability to print or dispense a paste or other fluid and/or low contamination of the MEMS with flux, to name just a few potential advantages, although the invention is not limited in this respect. Solders or other conductive materials may also optionally be used. The conductive pads may also optionally be omitted.

The vias may include conductive paths coupled between the conductive interconnect materials inside the chamber and the conductive interconnect materials outside the chamber. In the illustrated embodiment, the vias include vertical holes or other openings through the cap that are filled with or otherwise include a metal or other conductive material. Each of the vias includes a first terminal end or portion, and a second terminal end or portion. In the illustrated embodiment, each via includes a bottom that may be physically attached to and electrically connected to one of the upper contact structures. Each via likewise includes a top that may be outside of the chamber, and physically attached to, and electrically connected to, one of the conductive bumps. It is not required that the vias, or all the vias, be through the cap. In one or more embodiments of the invention, the vias may be through the substrate, or some vias may be through the substrate and other vias may be through the cap.

The optional conductive bumps are coupled with the tops of the vias and are exposed and accessible from the outside of the package. The conductive bumps may be used to electrically connect the package to an external signaling medium, for example through a surface mount technology (SMT). Conductive materials other than bumps, such as wires, for example, may also optionally be used. Still further, the conductive material outside the chamber may be omitted entirely, such as, for example, if the external signaling medium may be coupled directly to the vias.

Now, in one or more embodiments of the invention, the packages described above may be provided in an unconnected form in which the conductive pads of FIG. 1, or the vias of FIG. 4, are not coupled with to an external signaling medium. Alternatively, in one or more embodiments of the invention, the packages may be provided in a connected form in which the conductive pads or vias are coupled with an external signaling medium, such as, for example, a board or wireless device including a GSM transceiver or omnidirectional or dipole antenna.

Figure 5:
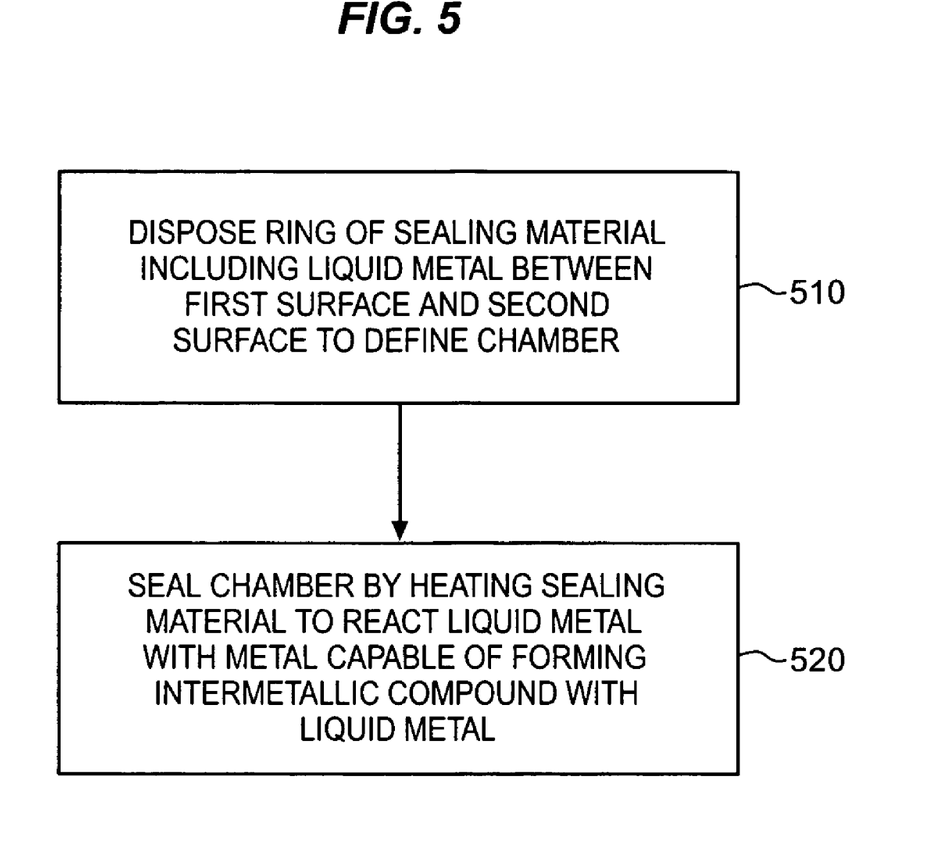
FIG. 5 shows a method of sealing a chamber by reacting a liquid metal to form one or more intermetallic compounds, according to one or more embodiments of the invention.

FIG. 5 shows a method of sealing a chamber by reacting a liquid metal to form one or more intermetallic compounds, according to one or more embodiments of the invention. The method includes disposing a ring of a sealing material including a liquid metal between a first surface and a second surface to define a chamber between the first surface, the second surface, and the ring of the sealing material, at block 510. Suitable liquid metals include, but are not limited to, liquid gallium, liquid indium-gallium (InGa), liquid tin gallium (SnGa), liquid cesium, and combinations thereof.

In one or more embodiments of the invention, the sealing material may include a paste or other composition including the liquid metal, such as, for example, the liquid gallium, and particles of, or at least including, one or more metals that are capable of forming one or more intermetallic compounds with the liquid metal. A non-limiting example of a paste may include liquid gallium, copper particles, and nickel particles, where the concentration of gallium may be from about 50 to 70%, the concentration of copper may be from about 0 to 40%, and the concentration of nickel may be from about 0 to 45% by weight. Such a paste may be formed, for example, at around room temperature by mechanical mixing the liquid gallium and one or more metal powders, and any desired additives, such as, for example, in an amalgamator, blender, or other mixer. Other methods may also optionally be used. In one aspect, the pastes may include small particles, such as, for example, those having an average diameter of from about 1 to 100 μm, or 10 to 50 μm. The small particles may help to provide a rapid reaction rate and may help to avoid an excessive standoff distance between the substrate and the cap. However, the use of such small particles is not required. If appropriate, prior to use, the prepared composition may optionally be stored at reduced temperature, such as, for example, at a temperature less than about 20° C., in order to increase stability and prolong shelf life. Alternatively, the paste may be prepared just prior to use.

The use of a paste including solid particles is not required. In one or more embodiments, a sealing material including a liquid metal, such as pure liquid gallium, and lacking a metal that may be capable of reacting with the gallium to form one or more intermetallic compounds, may be used. The sealing material may be applied to a surface, such as, for example, a contact structure, which includes a metal that may be capable of reacting with the liquid metal to form the one or more intermetallic compounds. In one or more embodiments of the invention, the amount of liquid gallium dispensed and the amount of metal capable of forming intermetallic compounds with the gallium in the contact pads may be based on the fixed ratio of the one or more intermetallic compounds. For example, the amount of gallium applied to a contact structure may be less than the stoichiometric amount to react with such metal in the contact structure to discourage excess liquid reagent remaining after reaction.

In disposing the paste or liquid sealing material between the first surface and the second surface, the sealing material may be applied or introduced over a surface of a substrate, a surface of a cap, or both. Suitable methods of applying such sealing materials over a surface include, but are not limited to, printing, such as, for example, stencil printing, and dispensing, such as, for example, of the type used to dispense solders. In dispensing, in one aspect, the material may be heated to a temperature that is greater than a melting point temperature of one or more metals of the sealing material. Fillers, such as, for example, silica, or other particles, may optionally be added to modify the viscosity for a printing, dispensing, or other application.

Then, after applying the sealing material, the cap and the substrate may be aligned face-to-face, and brought together and coupled, with the applied sealing material disposed therebetween, in order to define the chamber. In one aspect, this may include aligning matching or otherwise corresponding structures of the substrate and cap. For example, corresponding contact structures, sealing materials, contact pads, interconnect materials, or some combination, may be aligned. In the coupled assembly, the gallium or other liquid metal of the sealing material may wet the cap and the substrate or contact structures thereof.

Referring again to FIG. 5, the chamber may be sealed by heating the sealing material to react the liquid metal, such as, for example, the liquid gallium, with one or more metals that are capable of forming one or more intermetallic compound with the liquid metal, at block 520. The sealing material may harden as the one or more intermetallic compounds are formed in situ in the package as products of the reactions between the liquid metal and metal co-reactants. As the reaction proceeds, the free liquid gallium and the metal particles, if they are included, may be consumed and combined into the intermetallic compounds.

In one aspect, the temperature of formation of the intermetallic compounds may be substantially lower than certain other sealing materials. In one or more embodiments of the invention, the sealing material may be heated to a temperature in the range of from about 30 to 250° C., or higher, for a time sufficient to harden the sealing material. In one aspect, the temperature may be from about 50 to 200° C., or 100 to 150° C., depending upon the time allowed for hardening.

Table 1 lists reported hardening times versus temperatures for a 55 wt % Ga-45 wt % Ni composition with nickel particles of about 40 μm diameter.

TABLE 1

| TEMPERATURE (° C.) | HARDENING TIME (MINUTES) |
|---|---|
| 35 | 6000 |
| 50 | 2000 |
| 100 | 1200 |
| 150 | 100 |
| 200 | 10 |
| 250 | 2 |

The results show that the hardening time may decrease with increasing temperature. It is also believed that smaller particles may reduce the hardening time due, at least in part, to their greater surface area to weight ratio, and that hardening time may potentially increase when the amount of metal co-reactant is insufficient or limiting. In any event, the hardening time may readily be determined without undue experimentation for other sealing materials, by those skilled in the art, based on the present disclosure.

Now, these formation temperatures are lower than the formation temperatures of many other materials, such as, for example, the melting point temperatures of gold-tin solders and other non-lead solders. For example, a gold-tin solder may melt at a temperature of about 280° C. Such high temperatures may potentially result in thermal damage to the MEMS devices or other electronic devices and/or alter their performance characteristics. The gold may also make the solder expensive. High processing temperatures may also potentially be encountered during glass frit bonding, which may take place at temperatures ranging from 300 to 500° C.

Another potential advantage of the present sealing materials over glass frit bonding is that the footprints of the rings of the sealing materials disclosed herein may optionally be less than those currently experiences for glass frit bonding. This may allow a smaller package that may be better suited for deployment in a small electronic device, such as, for example, a cellular phone, pager, camera, personal digital assistant, PCMCIA (Personal Computer Memory Card International Association) card, or the like. Also, a smaller footprint may allow more dice to be produced per wafer, which may reduce processing and packaging costs per die.

Figure 6:
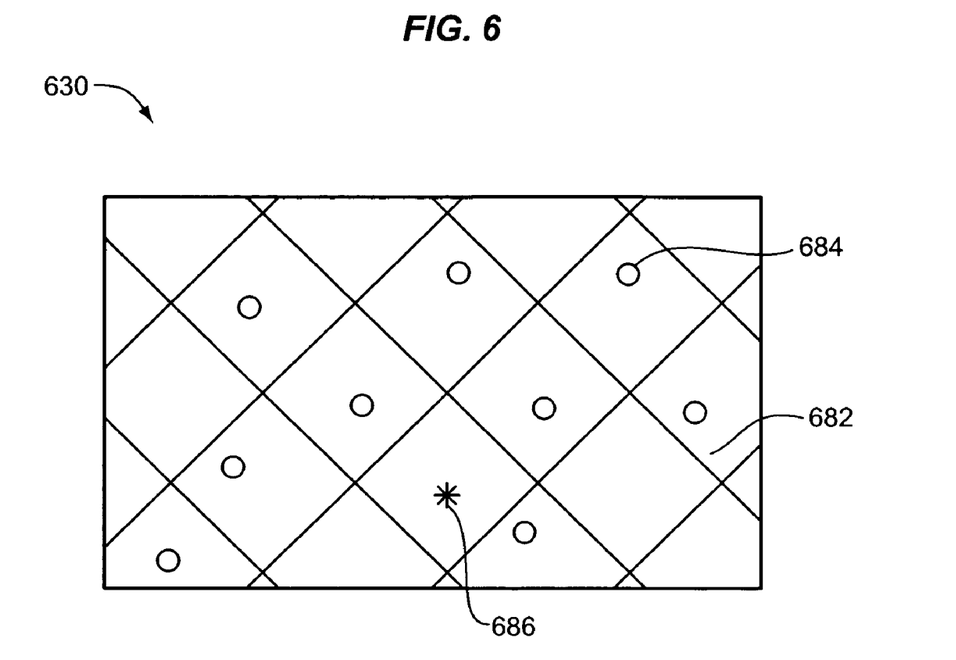
FIG. 6 shows a hardened sealing material including one or more intermetallic compounds, optional particles or other small solids dispersed in the sealing material, and one or more optional additives dispersed in the sealing material, according to one or more embodiments of the invention.

FIG. 6 shows a hardened sealing material 630 including one or more intermetallic compounds 682, optional particles 684 or other small solids dispersed in the sealing material, and one or more optional additives 686 dispersed in the sealing material, according to one or more embodiments of the invention. In various embodiments of the invention, the intermetallic compounds may be formed from gallium, cesium or other relatively low melting point temperature metals that may be printed, dispensed, or otherwise applied as a liquid. The particles may include one or more co-metal reactants that are capable of reacting with the liquid metal to form the one or more intermetallic compounds.

In one aspect, the metal particles may be included in excess or more than the stoichiometric amount to react with all of the gallium or other liquid metal so that the gallium or liquid metal may be the limiting reagent in the intermetallic compound formation reactions. The provision of excess metal may make the liquid metal the limiting reactant and encourage substantial depletion to avoid excess liquid metal, which may tend to weaken the seal. A portion of the metal particles may remain dispersed in the hardened sealing material and intermetallic compounds.

As will be further explained below, the metal particles are optional, and are not required. For example, in one or more other embodiments of the invention, gallium or another liquid metal may be introduced over a contact structure that includes a metal co-reactant that is capable of reacting with the gallium or other liquid metal to form the one or more intermetallic compounds.

The sealing material may also optionally include the one or more additives. The additives may modify a property, such as, for example, a thermal, electrical, adhesion or sealing property of the sealing material. For example, the sealing material may include filler having a lower or otherwise different coefficient of thermal expansion than an intermetallic compound of the sealing material, such as, for example, silica particles. The silica particles may help to reduce thermal expansion and make the thermal expansion more closely approximate that of the substrate, and may help to maintain the integrity of the seal over thermal excursions or cycles. As another example, a dielectric filler or material may optionally be included in the filler to make it less electrically conducting, if appropriate.

Packages having the chambers and sealing materials disclosed above may be formed by die-level bonding operations or wafer-level bonding operations, to name a few examples. In die-level bonding, a singulated die and die cap may be aligned and coupled, and then the sealing material hardened as described elsewhere herein. In one aspect, a flip-chip tool may be used for at least the alignment and coupling. The heating and intermetallic formation reactions may be performed in a batch oven or hot plate, for example, or heating capability may optionally be incorporated in the flip-chip tool.

In wafer-level bonding, a wafer including two or more un-singulated dice, each representing an independent but un-separated microelectronic device, and a wafer cap may be aligned, coupled, and the a sealing material may be hardened as described elsewhere herein. In one aspect, a wafer bonder may be used for at least the alignment and coupling. The heating and intermetallic formation reactions may be performed in a batch oven or hot plate, for example, or heating capability may optionally be incorporated in the bonder. The bonded wafer assembly may include an array of sealed chambers defined by the wafer, the wafer cap, and an array of hardened rings of sealing material including intermetallic compounds. The bonded wafer assembly may be singulated, diced, or otherwise separated into individual packages.

As a variation, a wafer including two or more un-singulated dice and a corresponding number of die caps may be aligned, coupled, and then sealing materials between the caps and the wafer may be hardened as described elsewhere herein. In one aspect, the caps may be pick-and-placed on the wafer. In another aspect, a flip-chip tool may be used to apply the caps in proper position on the wafer.

Wafer bonding may offer certain potential advantages, such as allowing for parallel production of package, and reduced manufacturing cost. The ability to print or dispense the sealing material over a wafer may lend itself well to mass production. Additionally, sealing the chambers of the packages prior to singulation and/or cleaning may potentially help to protect components in the chambers, such as, for example, MEMS, from damage, or contamination, which may potentially occur during singulation. However, the scope of the invention is not limited in this respect.

Figure 7:
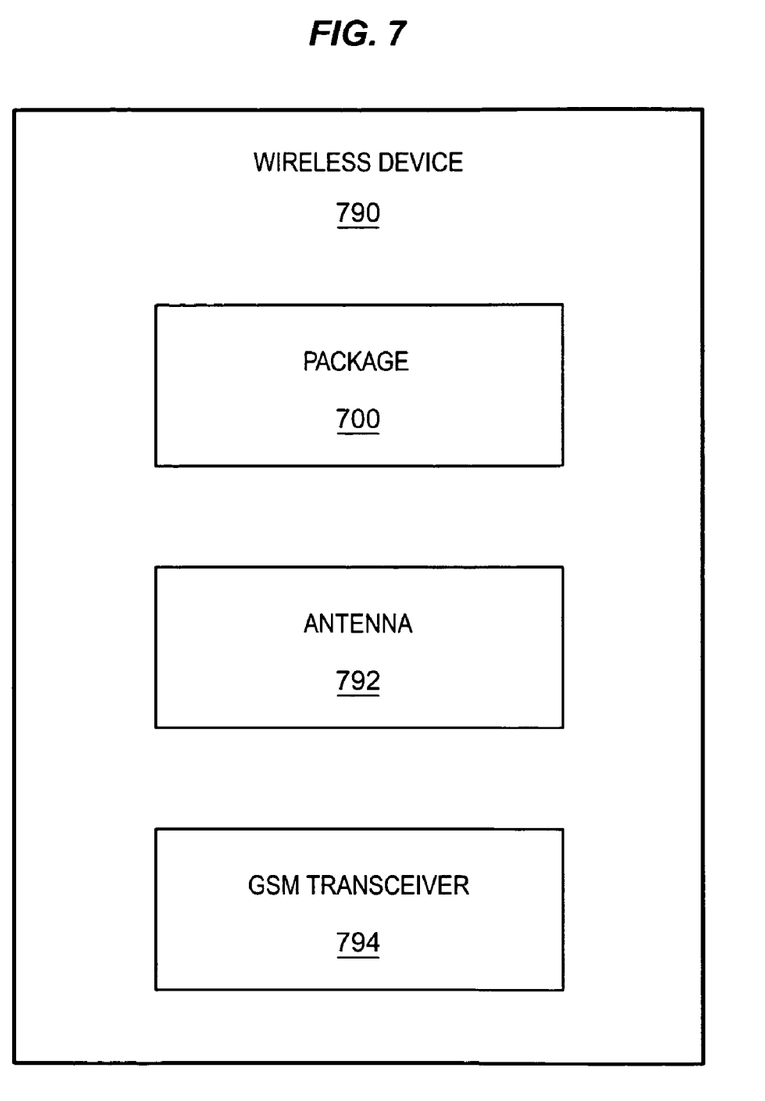
FIG. 7 shows a wireless device including a microelectronic package as disclosed herein, a GSM (Global System for Mobile communications) transceiver, and an antenna, such as, for example, an omnidirectional or dipole antenna, according to one or more embodiments of the invention.

The packages disclosed herein may be included and used in a wide variety of electronic devices. FIG. 7 shows a wireless device 790, according to one or more embodiments of the invention. The wireless device may include a cellular phone, personal digital assistant (PDA), computer card (for example local area network (LAN) card), or laptop computer, to name just a few examples. The wireless device includes a package 700. The package may have one or more of the characteristics of the packages described elsewhere herein. The wireless device also includes an antenna 792, such as, for example, an omnidirectional antenna or dipole antenna, and a GSM (Global System for Mobile communications) transceiver 794. The antenna may allow the wireless device to send and receive data. The GSM transceiver may allow the apparatus to utilize CDMA (Code Division Multiple Access), TDMA (Time Division Multiple Access), and/or W-CDMA (Wideband Code Division Multiple Access) communications, for example. Dipole antennas, omnidirectional antennas, and GSM transceivers are used in some, but not all, wireless devices. The wireless device may also include other optional components, which are not shown, such as a Flash memory, for example. In the case of the wireless device including a laptop computer, it may optionally include a DRAM memory, SRAM memory, graphics controller, or audio device, for example.

In the description above, for the purposes of explanation, numerous specific details have been set forth in order to provide a thorough understanding of the embodiments of the invention. Other embodiments may be practiced without some of these specific details. In other instances, well-known circuits, structures, devices, and techniques have been shown in block diagram form or without detail in order not to obscure the understanding of this description.

Many of the methods are described in their most basic form, but operations may be added to or deleted from the methods. Many further modifications and adaptations may be made. The particular embodiments are not provided to limit the invention but to illustrate it. The scope of the invention is not to be determined by the specific examples provided above but by the claims below.

In the claims, any element that does not explicitly state "means for" performing a specified function, or "step for" performing a specified function, is not to be interpreted as a "means" or "step" clause as specified in 35 U.S.C. Section 112, Paragraph 6. In particular, the use of "step of" in the claims herein is not intended to invoke the provisions of 35 U.S.C. Section 112, Paragraph 6.

It should also be appreciated that reference throughout this specification to "one or more embodiments" or "an embodiment" means that a particular feature may be included in the practice of the invention. Similarly, it should be appreciated that in the foregoing description of exemplary embodiments of the invention, various features are sometimes grouped together in a single embodiment, Figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated in this Detailed Description, with each claim standing on its own as a separate embodiment of this invention.

While the invention has been described in terms of several embodiments, the invention is not limited to the embodiments described, but may be practiced with modification and alteration within the spirit and scope of the appended claims. The description is thus to be regarded as illustrative instead of limiting.

What is claimed is:

1. An apparatus comprising:
   a die and a cap facing the die;
   a sealing material between the die and the cap, the sealing material including one or more intermetallic compounds of gallium and one or more metals selected from the group consisting of nickel, copper, silver, antimony, cobalt, gold, platinum, nickel-silver, copper-nickel, copper-silver, copper-tin, and combinations thereof;
   a chamber defined by the die, the cap, and the sealing material;
   one or more microelectromechanical systems coupled with the die within the chamber, and
   one or more interconnects to couple the one or more microelectromechanical systems with a signaling medium that is outside the chamber.

2. The apparatus of claim 1, further comprising a particle including one or more metals selected from nickel, copper, silver, antimony, cobalt, gold, platinum, nickel-silver, copper-nickel, copper-silver, copper-tin, and combinations thereof, dispersed in the sealing material.

3. A wireless device comprising a Flash memory and the apparatus of claim 1.

4. An apparatus comprising:
   a substrate and a cap facing the substrate;
   a sealing material between the substrate and the cap, the sealing material including one or more intermetallic compounds, wherein the one or more intermetallic compounds comprise an intermetallic compound including a metal having a melting point temperature that is less than 200° C., and wherein the one or more intermetallic compounds comprise an intermetallic compound including gallium;
   a chamber defined by the substrate, the cap, and the sealing material;
   one or more electronic components coupled with the substrate within the chamber, and
   one or more interconnects to couple the one or more electronic components with a signaling medium.

5. The apparatus of claim 4, wherein the intermetallic compound further comprises one or more metals selected from nickel, copper, silver, antimony, cobalt, gold, platinum, nickel-silver, copper-nickel, copper-silver, copper-tin, and combinations thereof.

6. The apparatus of claim 5, further comprising a particle including at least one of the one or more metals dispersed in the sealing material.

7. An apparatus comprising:
   a substrate and a cap facing the substrate;
   a sealing material between the substrate and the cap, the sealing material including one or more intermetallic compounds, wherein the sealing material consists essentially of non-organic materials;

a chamber defined by the substrate, the cap, and the sealing material;

one or more electronic components coupled with the substrate within the chamber, and one or more interconnects to couple the one or more electronic components with a signaling medium.

8. The apparatus of claim 7, wherein the substrate comprises one selected from a die and a wafer, and wherein the electronic component comprises a microelectromechanical system.

9. An apparatus comprising;
a first surface;
a second surface;
a solid sealing material including one or more intermetallic compounds between the first surface and the second surface, wherein the one or more intermetallic compounds comprise an intermetallic compound including a metal having a melting point temperature that is less than 100° C., and wherein the intermetallic compound comprises gallium; and
a chamber defined by the first surface, the second surface, and the sealing material.

10. The apparatus of claim 7, further comprising a microelectromechanical system coupled with the first surface within the chamber.

11. The apparatus of claim 1, wherein the intermetallic compound includes nickel, copper, or a combination of nickel and copper.

12. The apparatus of claim 4, wherein the one or more electronic components comprise one or more microelectromechanical systems.

13. The apparatus of claim 4, wherein the intermetallic compound has a melting point that is greater than 260° C.

14. The apparatus of claim 4, wherein the intermetallic compound includes nickel, copper, or a combination of nickel and copper.

15. The apparatus of claim 4, wherein the sealing material does not include organic material derived from solder flux.

16. A wireless device comprising a Flash memory and the apparatus of claim 4.

17. The apparatus of claim 7, wherein the one or more intermetallic compounds comprise one or more of gallium, indium, and cesium.

18. The apparatus of claim 7, wherein the one or more electronic components comprise one or more microelectromechanical systems.

19. The apparatus of claim 7, wherein the one or more intermetalic compounds have a melting point that is greater than 260° C.

20. An apparatus comprising:
a die and a cap facing the die;
a sealing material between the die and the cap, the sealing material including one or more intermetallic compounds, the one or more intermetallic compounds including one or more selected from the group consisting of gallium, indium, cesium, and antimony;
one or more microelectromechanical systems coupled with the die within the chamber, and
one or more interconnects to couple the one or more microelectromechanical systems with a signaling medium that is outside the chamber.

21. The apparatus of claim 20, further comprising a particle including one or more metals selected from nickel, copper, silver, antimony, cobalt, gold, platinum, nickel-silver, copper-nickel, copper-silver, copper-tin, and combinations thereof, dispersed in the sealing material.

22. The apparatus of clam 20, wherein the one or more intermetallic compounds include nickel, copper, or a combination of nickel and copper.

23. The apparatus of claim 20, wherein the one or more intermetallic compounds have a melting point that is greater than 260° C.

24. A wireless device comprising a Flash memory and the apparatus of claim 20.

* * * * *

UNITED STATES PATENT AND TRADEMARK OFFICE
CERTIFICATE OF CORRECTION

| | | |
|---|---|---|
| PATENT NO. | : 7,061,099 B2 | Page 1 of 1 |
| APPLICATION NO. | : 10/955872 | |
| DATED | : June 13, 2006 | |
| INVENTOR(S) | : Lu et al. | |

It is certified that error appears in the above-identified patent and that said Letters Patent is hereby corrected as shown below:

In column 14, at line 37, delete "scaling" and insert --sealing--.

In column 15, at line 24, delete "scaling" and insert --sealing--.

Signed and Sealed this

Second Day of September, 2008

JON W. DUDAS
*Director of the United States Patent and Trademark Office*